US 7,688,569 B2

(12) United States Patent
Borland et al.

(10) Patent No.: US 7,688,569 B2
(45) Date of Patent: Mar. 30, 2010

(54) THICK-FILM DIELECTRIC AND CONDUCTIVE COMPOSITIONS

(75) Inventors: William J. Borland, Chapel Hill, NC (US); Alton Bruce Jones, III, Timberlake, NC (US); Olga L. Renovales, Apex, NC (US); Kenneth Warren Hang, Hillsborough, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1718 days.

(21) Appl. No.: 10/801,257

(22) Filed: Mar. 16, 2004

(65) Prior Publication Data

US 2005/0207094 A1    Sep. 22, 2005

(51) Int. Cl.
    *H01G 4/06*    (2006.01)
(52) U.S. Cl. ............... 361/311; 361/313; 361/321.1; 361/321.2; 361/306.1; 361/306.2
(58) Field of Classification Search ............... 361/321.4, 361/321.5, 311–313, 301.1, 301.4, 321.1, 361/321.2, 306.1, 306.3; 501/136–138; 438/400, 420
See application file for complete search history.

(56) References Cited

U.S. PATENT DOCUMENTS

| | | | |
|---|---|---|---|
| 2,602,753 A | 7/1952 | Woodcock et al. | |
| 3,753,911 A | 8/1973 | Walker, Jr. et al. | |
| 3,975,307 A | 8/1976 | Matsuo et al. | |
| 4,082,906 A | 4/1978 | Amin et al. | |
| 4,377,840 A | 3/1983 | Nair | |
| 4,400,759 A | 8/1983 | Lagrange et al. | |
| 4,400,760 A | 8/1983 | Lagrange et al. | |
| 4,475,144 A | 10/1984 | Lagrange et al. | |
| 4,511,601 A | 4/1985 | Akse et al. | |
| 4,514,321 A | 4/1985 | Siuta et al. | |
| 4,530,031 A | 7/1985 | Donohue | |
| 4,612,600 A | 9/1986 | Hodgkins | |
| 4,764,494 A * | 8/1988 | Sakabe et al. | 501/138 |
| 5,155,072 A | 10/1992 | Bruno et al. | |
| 5,162,977 A | 11/1992 | Paurus et al. | |
| 6,060,165 A | 5/2000 | Asada et al. | |
| 6,317,023 B1 | 11/2001 | Felten | |
| 6,370,013 B1 * | 4/2002 | Iino et al. | 361/306.3 |

(Continued)

FOREIGN PATENT DOCUMENTS

EP    1 093 327 A    4/2001

(Continued)

OTHER PUBLICATIONS

Delaney, R.A., Kaiser, H.D., "Multiple-Curie-Point Capacitor Dielectrics", IBM Journal, 1967, pp. 511-519, XP002330451 *figure 2*.

(Continued)

*Primary Examiner*—Nguyen T Ha

(57) ABSTRACT

Dielectric powder and thick-film paste compositions are formed having high dielectric constants, low loss tangents, and other desirable electrical and physical properties. Conductive powder and paste compositions are formed having desirable electrical and physical properties. The dielectric powder and thick-film paste compositions can be used in combination with the conductive powder and paste compositions to form capacitors and other fired-on-foil passive circuit components.

22 Claims, 3 Drawing Sheets

U.S. PATENT DOCUMENTS 6,525,921 B1 * 2/2003 Nakatani et al. ......... 361/306.3
6,631,551 B1    10/2003 Bowles et al.
6,703,705 B2 *  3/2004 Yamazaki et al. ........... 257/692
6,910,266 B2 *  6/2005 Lee et al. ...................... 29/832

FOREIGN PATENT DOCUMENTS

GB    2 044 749 A    10/1980
JP    2-153589        6/1990

OTHER PUBLICATIONS

Darko Makovec, Miha Drofenik and Judith Baker, "Fluorine as a Donor Dopant in Barium Titanate", J. Am. Ceram. Soc., vol. 86, (3), (2003), pp. 495-500.

Tadashi Endo, Tetsuro Kobayashi, Tsugio Sato, and Masahiko Shimada, High Pressure Synthesis and Electrical Properties of $BaTiO_3-xF_x$, Journal of Materials Science, vol. 25, (1B), (1990) pp. 619-623.

V. Savopshchenko, A.M. Golub, M. I. Nekrasov, I. I. Boitko, and V. A. Gorbatyuk, Formation of Fluorine-Containing Barium Titanate-Based Solid Solutions, Inorganic Materials., vol. 8, (4) (1972), pp. 643-646.

* cited by examiner

| DIELECTRIC PASTE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| BARIUM TITANATE | 66.5 | 6.65 | 68.55 | 68.55 | 68.55 | 68.55 | 68.55 | 65.74 | 65.74 | 66.11 | 62.88 | 62.88 | 62.88 | 62.22 | 59.89 | 59.89 | 66.5 | 68.55 | 68.55 | 68.55 | 68.55 | 68.55 | 68.55 | 68.55 | 68.55 | 68.55 | 68.55 | 68.55 | 68.55 | 68.55 |
| LITHIUM FLUORIDE | | | | 1.0 | | 1.0 | 1.0 | | | | | | | | | | | 1.0 | 1.0 | | 0.21 | 0.21 | 0.21 | 0.21 | 0.21 | 0.16 | | | | |
| LITHIUM CARBONATE | | | | | | | | | | | | | | | | | 1.4 | | | 1.4 | 0.62 | 0.62 | 0.62 | 0.62 | 0.62 | 0.47 | | | | |
| BARIUM FLUORIDE | | 1.36 | 1.18 | | 2.6 | | | 1.58 | 1.58 | 1.39 | 1.32 | 1.32 | 1.32 | 1.44 | 1.44 | 1.44 | | 1.36 | | | 1.25 | 1.25 | 1.25 | 1.25 | 1.11 | 1.11 | 1.36 | 1.36 | 1.36 | 1.36 |
| ZINC FLUORIDE | | 0.74 | | | | | 1.36 | | | | | | | | | | | 0.74 | 0.74 | | | | | | | | 0.74 | 0.74 | 0.74 | 0.74 |
| CALCIUM FLUORIDE | | | | | | 2.0 | | 2.16 | 2.1 | 1.89 | 1.8 | 1.8 | 1.8 | 2.28 | 1.96 | 1.96 | 1.9 | | | 1.9 | 1.37 | 1.37 | 1.37 | 1.37 | 1.37 | 1.27 | | | | |
| MANGANESE FLUORIDE | | | 0.92 | | | | 0.74 | | | | | | | | | | | | | | | | | | | | | | | |
| MAGNESIUM FLUORIDE | | | | | | | | | | | | | | | | | | | | | | | | 0.15 | 0.15 | 0.15 | | | | |
| ZIRCONIA | 3.9 | | | | | | | 3.86 | 3.86 | 3.88 | 4.73 | 4.73 | 4.73 | 4.68 | 5.4 | 5.4 | 3.9 | | | 1.0 | 1.0 | 1.5 | 2.0 | 1.5 | 1.0 | 1.0 | | | | |
| GLASS A | 11.8 | 10.3 | 10.25 | | | 9.3 | 12.0 | 11.67 | 11.67 | 11.73 | 14.28 | 14.28 | 14.28 | 14.13 | 16.3 | 16.3 | 11.8 | 10.25 | 10.25 | | | | | | | | 10.25 | 10.25 | 10.25 | 10.25 |
| GLASS B | | | 1.0 | | | | 1.0 | | | | | | | | | | | 1.0 | 1.0 | | 16.0 | 16.0 | 16.0 | | 16.0 | 16.0 | 1.0 | 1.0 | 1.0 | 1.0 |
| GLASS C | | | 1.0 | | | | 1.0 | | | | | | | | | | | 1.0 | 1.0 | | | | 16.0 | | | | | 1.0 | 1.0 | 1.0 |
| GLASS D | | | | 12.25 | 12.25 | | | | | | | | | | | | | | | 16.0 | | | | 16.0 | | | | | | |
| VEHICLE | 6.6 | 6.5 | 5.9 | 7.5 | 7.1 | 6.5 | 6.0 | 5.5 | 5.5 | 5.5 | 5.5 | 5.5 | 5.5 | 5.5 | 5.5 | 5.5 | 6.6 | 5.9 | 5.9 | 4.0 | 4.0 | 4.0 | 4.0 | 4.0 | 4.0 | 4.0 | 5.9 | 5.9 | 5.9 | 5.9 |
| SOLVENT 1 | 9.7 | 11.5 | 8.7 | 9.2 | 8.0 | 11.05 | 8.75 | 8.05 | 8.05 | 8.05 | 8.05 | 8.05 | 7.8 | 8.05 | 8.05 | 8.05 | 9.7 | 8.7 | 8.7 | 4.0 | 4.0 | 4.0 | 4.0 | 4.0 | 4.0 | 4.0 | 8.7 | 8.7 | 8.7 | 8.7 |
| SOLVENT 2 | | | | | | | | | | | | | | | | | | | | 10.4 | 10.4 | 10.4 | 10.4 | 10.4 | 10.4 | 10.4 | | | | |
| OXIDIZER | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | | 1.0 | 1.0 | 1.0 | 1.0 |
| PHOSPHATE WETTING AGENT | 0.5 | 0.5 | 0.5 | 0.5 | 0.5 | 0.5 | 0.5 | 0.45 | 0.45 | 0.45 | 0.45 | 0.7 | 0.45 | 0.45 | 0.45 | 0.45 | 0.5 | 0.5 | 0.5 | 0.5 | 0.5 | 0.5 | 0.5 | 0.5 | 0.5 | 0.5 | 0.5 | 0.5 | 0.5 | 0.5 |
| TOTAL | 100.0 | 100.55 | 99.0 | 100.0 | 100.0 | 99.9 | 99.9 | 100.01 | 100.01 | 100.01 | 100.01 | 100.01 | 99.99 | 99.99 | 99.99 | 99.99 | 105.45 | 100.0 | 100.0 | 108.75 | 108.91 | 109.41 | 109.91 | 109.41 | 107.6 | 107.91 | 100.0 | 100.0 | 100.0 | 100.0 |

FIG. 1

| DIELECTRIC SAMPLE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| COPPER UNDERPRINT | A | A | A | A | A | A | A | A | B | B | A | B | C | A | A | C | A | A | B | A | A | A | A | A | A | A | D | D | E | E |
| COPPER ELECTRODE | A | A | A | A | A | A | A | A | B | B | A | B | C | A | A | C | A | A | B | A | A | A | C | A | A | A | A | D | A | E |
| K AT ROOM TEMPERATURE | 690 | 677 | 833 | 1408 | 1110 | 755 | 1190 | 2413 | 1200 | 2467 | 1500 | 1773 | 950 | 1677 | 1234 | 1357 | 3326 | 4830 | 3236 | 3064 | 3643 | 2857 | 2545 | 2070 | 3530 | 2837 | 4441 | 4041 | 2900 | 1300 |
| DF % AT 10 KHz | 5.5 | 2.3 | 7.1 | 4.0 | 6.0 | 1.5 | 0.4 | 2.5 | 0.3 | 1.4 | 2.5 | 4.1 | 1.6 | 1.5 | 3.8 | 1.4 | 2.0 | 1.0 | 0.4 | 1.7 | 1.7 | 1.1 | 1.0 | 0.5 | 2.5 | 1.0 | 1.0 | 0.8 | 0.9 | 21.8 |
| CURIE POINT °C | 125 | 125 | 125 | 45 | -15 | 105 | -35 | 5 | -50 | 0 | 40 | 25 | -15 | -15 | 45 | -20 | 15 | 25 | 0 | 15 | 15 | 15 | 15 | 15 | 25 | -15 | 5 | 5 | 5 | 4.5 |
| K AT CURIE POINT | 1242 | 982 | 1218 | 1449 | 1325 | 1120 | 1312 | 2576 | 1787 | 2875 | 1609 | 1773 | 1495 | 1964 | 1533 | 1495 | 3393 | 4830 | 4830 | 3243 | 3795 | 2760 | 2829 | 3105 | 3530 | 3512 | 4961 | 4860 | 3329 | 1385 |
| BaTiO₃ GRAIN SIZE (MICRONS) | 0.5-0.5 | 0.3-0.5 | 0.3-0.5 | 0.3-0.5 | 0.3-0.5 | 0.3-0.5 | 0.3-0.5 | 0.5-2.0 | 0.3-1.0 | 0.3-2.0 | 0.3-1.0 | 0.3-1.0 | 0.3-1.0 | 0.3-1.5 | 0.3-1.0 | 0.3-1.0 | 0.5-3.0 | 1.0-8.0 | 1.0-8.0 | 1.0-4.0 | 1.0-6.0 | 1.0-6.0 | 1.0-3.0 | 1.0-4.0 | 1.0-8.0 | 1.0-8.0 | | | | |

FIG. 3

THICK-FILM DIELECTRIC AND CONDUCTIVE COMPOSITIONS

RELATED APPLICATIONS

This application is related to application Ser. No. 60/418,045, filed in the United States Patent and Trademark Office on Oct. 11, 2002, now U.S. National application Ser. No. 10/651,367, and entitled "CO-FIRED CERAMIC CAPACITORS AND METHOD FOR FORMING CERAMIC CAPACITORS FOR USE IN PRINTED WIRING BOARDS," and application Ser. No. 60/433,105 filed in the United States Patent and trademark Office on Dec. 13, 2002, now U.S. application Ser. No. 10/633,551 filed in the United States Patent and Trademark Office on Sep. 16, 2003 and entitled "PRINTED WIRING BOARDS HAVING LOW INDUCTANCE EMBEDDED CAPACITORS AND METHODS OF MAKING SAME".

BACKGROUND

1. Technical Field

The technical field is circuit components. More particularly, the technical field includes powders and pastes used to form dielectric and conductive elements.

2. Related Art

Passive components may be embedded in printed wiring board innerlayer panels that are stacked and connected by interconnection circuitry, the stack of panels forming a printed wiring board. Embedded capacitors are subject to requirements such as acceptable capacitance density, low dielectric loss, high breakdown voltage, and good stability of capacitance within specified temperature ranges. For example, Electrical Industry Association designation Z5U requires that a capacitor's capacitance vary by not more than +/−22% over the temperature range of 10-85° C., and Electrical Industry Association designation Y5V requires a dissipation factor (Df) of less than 3%. The physical and electrical properties of embedded components are largely dependent on the materials used to form dielectric elements, conductive elements, and other elements of the components.

Barium titanate is commonly selected as the base material for pastes used to form high capacitance thick-film dielectrics. In components such as capacitors, high dielectric constants (K) for dielectric layers are desirable because they allow for smaller capacitor size. Pure barium titanate has its maximum capacitance at its Curie point, which is at 125° C., making pure barium titanate unsuitable for many applications. The addition of dopants, however, combined with high temperature processing, is a common method for shifting the Curie point of barium titanate-based materials. Specific amounts and/or chemistries of dopants may be chosen to place the Curie point where it is desired, such as at 25° C., so that the capacitance at room or near temperature is maximized.

Conventional dopants such as barium zirconate, niobium oxide, and strontium titanate may not be suitable for all applications, such as firing at the lower temperatures used in thick-film processing. For example, conventional multilayer ceramic capacitors with such dopants are typically sintered for two (2) hours or more in air or in reducing atmospheres, at peak temperatures in the vicinity of 1100° C. to 1400° C. The conventional dopants are not effective for fired-on-foil applications performed using nitrogen-based thick-film firing profiles of shorter duration and lower temperatures.

High capacitance thick-film dielectric materials such as pastes are further constrained by the requirement of sintering aids, which must be added to barium titanate in order to form a well-sintered dielectric. Conventional sintering aid glasses such as lead boro-silicates, however, have lower dielectric constants and their inclusion lowers the dielectric constant of the resulting composite. The level of glass required for conventional formation of a well-sintered dielectric often results in very low dielectric constants.

Conductive pastes are used to form the capacitor electrodes of fired-on-foil capacitors. Thick-film conductive pastes typically have a metal powder component and a glass powder component dispersed in an organic vehicle. During firing, the metal powder sinters together and the glass forms a bond with the substrate. Conventional conductive pastes that are fired on substrates of materials such as alumina are designed for conductor properties, and not for electrode properties. Therefore, the pastes are generally thicker than is desirable for capacitor electrodes and contain glasses that are not chemically or physically compatible with a barium titanate-based dielectric.

SUMMARY

According to a first embodiment, a fired thick-film dielectric exhibits barium titanate grain sizes of at least 0.5 micron.

According to another embodiment, a dielectric powder comprises barium titanate powder, a lithium source and at least one metal fluoride powder, wherein the metal fluoride powder includes a zinc fluoride powder and lead germanate glass powder. The powder composition can be dispersed in an organic vehicle to form a screen-printing composition.

According to yet another embodiment, a copper-based electrode powder comprises copper powder, cuprous oxide powder, and lead germanate glass powder. The copper-based electrode powder can be dispersed in an organic vehicle to form a screen-printing copper electrode composition.

The dielectric and conductive compositions according to the above embodiments can be used to form circuit components such as capacitors. The capacitors can be embedded in printed wiring board innerlayer panels which may in turn be incorporated into printed wiring boards. The capacitors have high dielectric constants and low dissipation factors.

Those skilled in the art will appreciate the above stated advantages and other advantages and benefits of various additional embodiments of the invention upon reading the following detailed description of the embodiments.

BRIEF DESCRIPTION OF THE DRAWINGS

The detailed description will refer to the following drawings, wherein like numerals refer to like elements, and wherein:

FIG. 1 is a table illustrating the compositions used to form dielectric paste embodiments according to the present invention;

FIG. 3 is table of physical and electrical properties for capacitors formed using dielectric paste and conductive paste embodiments according to the present invention.

DETAILED DESCRIPTION

Figure 2A:
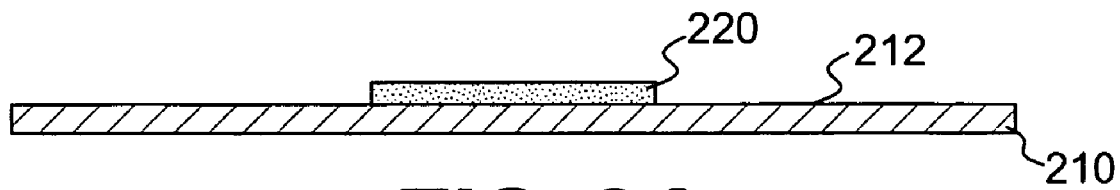
FIGS. 2A-2D illustrate a method of forming a fired-on-foil capacitor using dielectric paste and conductive paste embodiments according to the present invention.

The invention concerns: (1) high dielectric constant thick-film barium titanate-based dielectric powder and paste compositions; (2) conductive powder and paste compositions; and (3) capacitors and other components formed using dielectric paste and conductive paste embodiments. Thus, in this detailed description, high dielectric constant thick-film barium titanate-based dielectric powder and paste compositions are disclosed; copper thick-film electrode powder and paste compositions are also disclosed; and fired-on-foil circuit components are disclosed. The high dielectric constant thick-film barium titanate-based dielectric paste compositions and the copper thick-film electrode paste compositions discussed in this specification may be used, for example, to form fired-on-foil passive circuit components. The thick-film barium titanate-based dielectric powder and paste compositions are used to form dielectrics having high dielectric constants (K) after firing.

The dielectrics formed from the dielectric paste compositions may be "thick-film" dielectrics having fired dielectric thicknesses in the range of about 10-60 microns. Other embodiments have thicknesses in the range of 15-50 microns. In one embodiment, dielectrics may have dielectric constants on the order of 3000, and in another embodiment, dielectric constants of close to 5000. The high dielectric constant dielectrics may also have Z5U temperature stability characteristics and low dissipation factors.

The dielectrics formed from the dielectric paste compositions may have grain sizes in the range of 0.5 to 8 microns. In the embodiments discussed in this specification, the term "paste" generally refers to a thick-film composition suitable for screen-printing. The thick-film pastes according to the present embodiments comprise finely divided particles of ceramic, glass, metal or other inorganic solids, having particle sizes on the order of 1 micron or less, and an "organic vehicle" consisting of polymers dissolved in a mixture of dispersing agent and organic solvent. Specific paste compositions are discussed in detail below.

FIG. 1 is a table illustrating the individual compositions used to form thirty examples of dielectric paste according to the present invention. The ingredients are displayed in units of grams. FIG. 1 also illustrates the ingredients comprising the dielectric powders used in forming the dielectric pastes. The ingredients that form the powders are the paste ingredients less the solvents, vehicle, oxidizer and phosphate wetting agent. Table 1 defines the chemistry of several ingredients used in the dielectric compositions of Examples 1-30 shown in FIG. 1.

TABLE 1

| | |
|---|---|
| GLASS A | Lead germinate of the composition $Pb_5Ge_3O_{11}$ |
| GLASS B | $Pb_5GeSiTiO_{11}$ |
| GLASS C | $Pb_4BaGe_{1.5}Si_{1.5}O_{11}$ |
| GLASS D | $Pb_5Ge_{2.5}Zr_{0.5}O_{11}$ |
| VEHICLE | Ethyl cellulose N200 (11%) and Texanol (89%) |
| SOLVENT 1 | TEXANOL ® (available from Eastman Chemical Co.) |
| SOLVENT 2 | DOWANOL ® PPh (available from Dow Chemical Co.) |
| OXIDIZER | Barium nitrate powder (84%) and Vehicle (16%) |

In FIG. 1, the powder ingredients were combined to form the high dielectric constant dielectric powder mixtures. High K thick-film dielectric pastes, according to the Examples, were formed by dispersing the high dielectric constant powder mixture into the vehicle, solvents, oxidizer and phosphate wetting agent. Dispersing was performed on a three-roll mill, and paste-like compositions suitable for screen-printing were formed. The organic vehicle provided good application properties such as good screen-printing properties. The solvents provided viscosity control, and the phosphate wetting agent enhanced the dispersion qualities of the pastes. The oxidizer enhanced the organic component burn out for firing of the paste in nitrogen atmospheres.

The resulting thick-film dielectric pastes are suitable for firing under thick-film firing conditions. The dielectric pastes can be used to form components such as, for example, capacitors, and other components. A method of forming a fired-on-foil capacitor using dielectric paste embodiments of the present invention is discussed in detail below with reference to FIGS. 2A-2D.

In Examples 1-30, the thick-film glass components are inert with respect to the barium titanate and act to cohesively bond the composite together and to bond the composite to a substrate. The amounts of glass added to the compositions were selected so that the dielectric constant of the barium titanate was not excessively diluted. Lead germanate glass of the composition $Pb_5Ge_3O_{11}$ (Glass A in Table 1) is a ferroelectric glass that has a dielectric constant of approximately 150. Lead germanate glass can be added in quantities to form a well-sintered composite without excessively diluting the dielectric constant of the resulting barium titanate composite. Modified versions of lead germanate are also suitable. For example, lead may be partially substituted by other large ionic radii valence 2 cations, such as barium. Germanium may also be partially substituted by small ionic radii valence 4 cations such as silicon, zirconium and/or titanium, as in Glasses B-D.

Pure barium titanate has its maximum capacitance at its Curie point, which is at 125° C. Dopants were used to shift the Curie point to at or about room temperature (25° C.) and to promote grain growth of the barium titanate. Grain growth created a higher dielectric constant with a sharper temperature coefficient of capacitance (TCC). The barium titanate of the pastes may be pre-doped or dopants may be added separately to the paste. According to selected present embodiments, as shown in FIG. 1, small amounts of lithium salt Curie point shifters were combined with zinc fluoride to shift the Curie point and to enhance grain growth, thereby increasing room temperature K. Lithium sources were used in Examples 4-30.

In Examples 18, 19 and 21-26, zinc fluoride was alloyed with other fluorides to achieve specific properties in conjunction with copper conductive pastes A through C. Other additives were added to achieve specific properties. For example, zirconia (added in Examples 1, 8-17 and 20-26) improved resistance to etching baths routinely used in the printed wiring board industry. FIG. 3 sets forth the resulting physical and electrical properties of the dielectric compositions when used to form capacitors. FIG. 3 is discussed in detail below.

Conductive pastes may be used to form capacitor electrodes of fired-on-foil capacitors. The electrode materials should be chosen to maximize the dielectric capacitor performance. Accordingly, the electrode should undergo physical and chemical changes during the firing process that are compatible with the dielectric, such as equivalent shrinkage during sintering. In addition, chemical interactions during sintering should be selected so as to optimize electrical performance. The conductive paste should have good coverage on the dielectric to provide for high capacitance and should adhere well to the dielectric for a good dissipation factor. Additional requirements include the ability to co-fire with the dielectric and to be applied as a very thin layer. Table 2 illustrates five embodiments of copper-based pastes A, B, C, D and E according to the present invention. The ingredients are displayed in units of grams. The copper paste compositions A, through E were prepared by roll milling the ingredients listed for each paste.

TABLE 2

| ELECTRODE PASTE | A | B | C | D | E |
|---|---|---|---|---|---|
| Copper powder | 58.4 | 58.05 | 57.7 | 61.9 | 64.7 |
| Nickel powder | — | 0.35 | 0.7 | — | — |
| Glass A | 1.7 | 1.7 | 1.7 | — | 1.9 |
| Cuprous oxide powder | 5.8 | 5.8 | 5.8 | 6.1 | — |
| Vehicle | 11.7 | 11.7 | 11.7 | 14.3 | 15.0 |
| Texanol ® solvent | 12.9 | 12.9 | 12.9 | 17.2 | 17.9 |
| Variquat ® CC-9 NS surfactant (available from Barton Solvents, Inc.) | 0.5 | 0.5 | 0.5 | 0.5 | 0.6 |

The copper paste embodiments sinter during firing. The desired sintering temperature is determined by the metallic substrate melting temperature, the electrode melting temperature, and the chemical and physical characteristics of any adjacent layers present during firing. For example, if dielectric and conductive pastes are used to form a capacitor, the chemical and physical properties of an adjacent dielectric layer would be used to determine a desired sintering temperature for the electrode paste.

In the above embodiments, the sintering temperature and time at peak temperature during firing may be chosen to obtain maximum densification of the dielectric and any specific properties desired from any dopant included in the dielectric composition. High densification leads to high dielectric constants through elimination of porosity. If a capacitor is embedded inside a printed wiring board and encapsulated with epoxy resin, a density that provides for physical properties sufficient to withstand the embedding process may be acceptable. The dielectric and conductive paste embodiments described above can be fired in nitrogen using a peak temperature of between about 800° C. and 1050° C. Time at peak temperature may vary from 10 minutes to over 30 minutes. Typically, the firing cycle is approximately 10 minutes at a peak of 900° C. with a total time in the furnace of 1 hour.

Circuit components discussed in this specification may be formed by fired-on-foil technology. FIGS. 2A-2D illustrate a method of manufacturing a fired-on-foil capacitor structure 200 that was performed using the dielectric and conductive pastes discussed above. FIG. 2A is a front elevational view of a first stage of manufacturing the capacitor structure 200. In FIG. 2A, a copper foil 210 was pretreated by applying and firing an underprint 212 to form the first electrode. The underprint 212 was formed by screen-printing a conductive paste layer through a 400 mesh screen to form a square area of 1.75 cm by 1.75 cm. The paste was dried at 120° C. for 10 minutes in air in an oven, and the foil was fired at 900° C. in nitrogen for 10 minutes at peak temperature.

Figure 2B:
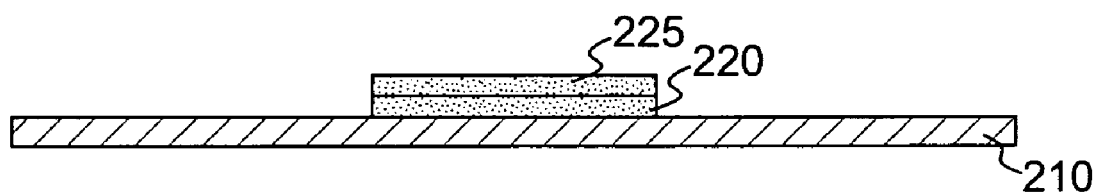

A dielectric paste was screen-printed onto the underprint area of the pretreated foil 210 so that the dielectric area was contained within the underprint area. The dielectric paste was screen-printed through a 230 mesh screen to form a dielectric layer 220 that was 1.25 cm by 1.25 cm. in area. The first dielectric layer 220 was then dried at 120° C. for 10 minutes in air in an oven. Referring to FIG. 2B, a second dielectric layer 225 was applied and dried. The total thickness of the two dried dielectric layers was approximately 30 microns.

Figure 2C:
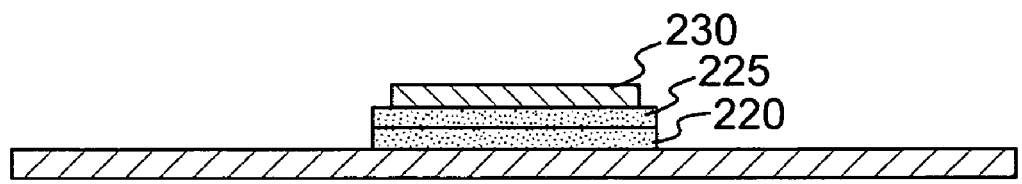
Figure 2D:
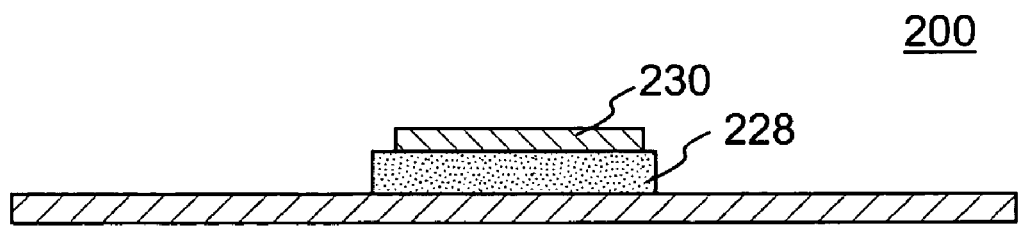

Referring to FIG. 2C, a second or top electrode 230 was formed by screen-printing a conductive paste over the second dielectric layer 225. The second electrode 230 was 0.9 cm by 0.9 cm in size. In some cases, the second electrode was formed using the same paste as was used to form the underprint 212. In other cases, the second electrode was of a different composition than that of the underprint 212. The resulting article was then dried at 120° C. for 10 minutes in air and then fired at 900° C. in nitrogen for 10 minutes at peak. The finished capacitor 200 is shown in FIG. 2D. During firing, the glass component of the dielectric paste softens and flows, coalesces, and encapsulates the barium titanate to form a fired dielectric 228. The dielectric 228 had a fired thickness of between 20 and 24 microns and the second electrode 230 had a fired thickness of between 3 and 5 microns.

Examples 1-30 of the dielectric paste compositions illustrated in FIG. 1 and the electrode paste compositions A-E illustrated in Table 2 were evaluated by forming capacitors using the methodology illustrated in FIGS. 2A-2D. The capacitors were then tested using a Hewlett Packard 4262A LCR meter for capacitance and dissipation factor (Df) at 1 KHz and 10 KHz. The thickness of the dielectric was measured and the dielectric constant was calculated from the following formula:

$$K = \frac{C*T}{0.885*A}$$

where C=capacitance in nanofarads (nF)
T=thickness in microns
A=area in square cm
0.885=a constant.

FIG. 3 is table of physical and electrical properties for the capacitors formed from the dielectric paste and conductive paste embodiments and tested at 10 KHz. The capacitances were tested at several temperatures between −55° C. and 125° C. using a Hewlett Packard 4278A LCR meter to establish the position of the Curie point. The data in FIG. 3 show that high dielectric constants were obtained by use of barium titanate and specific combinations of dopants in combination with specific electrode and underprint compositions. The combinations placed the Curie points close to room temperature and grew large barium titanate grains. A better dissipation factor Df was observed when the Curie point was less than room temperature.

The Curie point of the dielectric paste embodiments were shifted to room temperature by a lithium source. Examples 1-3 illustrate that without a lithium source (lithium fluoride or lithium carbonate), the Curie point remains at 125° C. As shown in examples 4 and 5, a lithium source shifted the Curie point. As shown in example 6, the addition of calcium fluoride reduced this effectiveness and shifted the Curie point only to 105° C. This effect was presumably due to the high melting point of calcium fluoride. Example 7 shows that addition of barium fluoride and manganese fluoride in quantities to form a low melting point combination helped the lithium source shift the Curie point very effectively. Thus, the lithium source was most effective in shifting the Curie point when it was in a quite fluid form at the firing temperature. Lithium on its own or in combination with the fluorides in examples 6 and 7, however, did not facilitate growth of the barium titanate grains.

As shown in dielectric examples 8 through 26, growth of the barium titanate grains was most effectively facilitated by a zinc source. Growth of the barium titanate grains produced high dielectric constants by sharpening the Curie point. Zinc sources are corrosive to barium titanate, dissolving small particles and precipitating them onto larger particles, thus growing the average particle size of the barium titanate. The zinc source in the above examples was zinc fluoride. In examples 10 through 17, zinc fluoride was used alone with the lithium source, and high dielectric constants were realized.

However, because zinc fluoride melts at 947° C., it may not be optimally effective in growing the grains when the composition is fired at 900° C. As shown in examples 18 through 29, however, when fluxed with other fluorides to produce a low melting point composition, the zinc fluoride was very effective in growing the barium titanate grains at 900° C. As a result, very high dielectric constants were realized. Effective fluoride combinations to produce low melting point combinations included barium fluoride and zinc fluoride combined with the lithium source.

Examples 9, 13, 16 and 19 show the effects of nickel doping of the capacitor electrode. The nickel addition to the copper pastes had a beneficial effect in that it moved the Curie point to lower temperatures. Examples 27 and 28 show the effects of omitting glass A from the underprint composition and from both the underprint and top electrode compositions. The capacitance and Df were satisfactory, and the Curie point was shifted slightly to lower temperatures. Example 29 shows the effect of omitting copper oxide from the preprint. The electrical data were acceptable. However, in example 30, when copper oxide was omitted from both the preprint and the top electrode, the dielectric constant was reduced significantly and the Df was increased significantly.

Compositions such as example 18 may be tailored using fluoride and lithium source combinations. These compositions have very low melting points in combination with specific electrode compositions and very high room temperature dielectric constants, such as 4800. Such compositions, however, have sharp Curie peaks. If a flatter response of the dielectric constant to temperature is required, use of less fluid dopant combinations and/or additions of zirconia may be employed. Such compositions achieve dielectric constants close to 3000. Zirconia also has an additional benefit in that it renders the dielectric more resistant to the acid etchants used in printed wiring board manufacture. Other additives, such as titania, may also be added to control grain growth and improve etch resistance. Compositions may also be tailored to have lower K but with very low dissipation factors at room temperature by positioning the Curie point at low temperatures.

Capacitors and other components and elements produced using the paste and powder embodiments of the present invention are suitable for embedding in printed wiring boards. For example, the capacitor 200 illustrated in FIG. 2D may be laminated to a laminate material and etched to create an innerlayer panel with embedded capacitors. The innerlayer panel may be laminated to additional innerlayer panels to form a printed wiring board.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

What is claimed is:

1. A thick-film dielectric fired on copper foil, wherein the dielectric comprises barium titanate, a glass comprising lead and germanium, a zinc source, and a lithium source, and
    wherein the barium titanate in the fired dielectric exhibits grain sizes of at least 0.5 microns, and the Curie point of the fired dielectric is in the range of −35° C. to 45° C.

2. The thick-film dielectric on copper foil of claim 1, wherein the dielectric has a thickness in the range of 10 to 60 microns.

3. The thick-film dielectric on copper foil of claim 1, further comprising:
    an underprint layer disposed between the dielectric and the copper foil.

4. The thick-film dielectric on copper foil of claim 1, wherein the dielectric comprises barium titanate, zinc fluoride, lead germanate, and at least one of lithium carbonate and lithium fluoride.

5. A capacitor, comprising:
    the thick-film dielectric on copper foil of claim 1, wherein the copper foil forms a first electrode; and
    a second electrode disposed over the dielectric.

6. The capacitor of claim 5, wherein the second electrode comprises copper, cuprous oxide, and lead germanate.

7. An innerlayer panel comprising the capacitor of claim 5.

8. A printed wiring board comprising the innerlayer panel of claim 7.

9. A dielectric powder, comprising:
    barium titanate powder;
    a lithium source and at least one metal fluoride powder, wherein the metal fluoride powder includes a zinc fluoride powder; and
    lead germanate glass powder.

10. The dielectric powder of claim 9, wherein the dielectric powder comprises 73-88% by weight of the barium titanate powder.

11. The dielectric powder of claim 10, wherein the dielectric powder comprises 1-5% by weight of a combination of the lithium source and the at least one metal fluoride powder.

12. The dielectric powder of claim 11, wherein the lithium source comprises at least one of lithium carbonate and lithium fluoride.

13. The dielectric powder of claim 10, wherein the dielectric powder comprises 8-25% by weight of the lead germanate glass powder.

14. The dielectric powder of claim 9, further comprising:
    glass powder comprising at least one of barium, strontium, calcium, zinc, magnesium and manganese.

15. The dielectric powder of claim 9, further comprising:
    glass powder comprising at least one of silicon, zirconium, titanium and tin.

16. The dielectric powder of claim 9, further comprising:
    zirconia powder in an amount that is between ¹⁄₂₅ and ⅓ of the weight of the lead germanate glass powder.

17. A screen-printing composition, comprising:
    the dielectric powder composition of any of claims 9 through 16 dispersed in an organic vehicle; and
    a solvent.

18. A method of making a thick-film capacitor, comprising:
    providing a metallic foil;
    forming a dielectric over the metallic foil using the dielectric powder of any of claims 9-16; and
    in any order, firing the dielectric using a peak firing temperature of between 800° C. and 1050° C., and forming an electrode over the dielectric.

19. The method of claim 18, wherein the dielectric and the electrode are formed by a single firing step in a nitrogen environment.

20. The method of claim 18, wherein the foil is a copper foil.

21. The method of claim 20, wherein:
   the dielectric has a thickness in the range of 10 to 60 microns; and
   the Curie point of the dielectric is in the range of −35° C. to 45° C.

22. The method of claim 18, wherein the electrode is formed from a powder comprising:
   copper powder;
   cuprous oxide powder; and
   lead germinate glass powder.

* * * * *